(12) United States Patent
Kim et al.

(10) Patent No.: US 10,991,894 B2
(45) Date of Patent: Apr. 27, 2021

(54) COMPOUND OF ORGANIC SEMICONDUCTOR AND ORGANIC SEMICONDUCTOR DEVICE USING THE SAME

(71) Applicants: FOUNDATION OF SOONGSIL UNIVERSITY-INDUSTRY COOPERATION, Seoul (KR); Industry-University Cooperation Foundation Hanyang University, Seoul (KR)

(72) Inventors: Do Hwan Kim, Anyang-si (KR); Hojin Lee, Seoul (KR); Han Wool Park, Seoul (KR); Keun-Yeong Choi, Seoul (KR); Moon Sung Kang, Seoul (KR); Haejung Hwang, Seoul (KR); Ji Hye Shin, Seoul (KR)

(73) Assignees: FOUNDATION OF SOONGSIL UNIVERSITY-INDUSTRY COOPERATION, Seoul (KR); INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 157 days.

(21) Appl. No.: 16/192,399

(22) Filed: Nov. 15, 2018

(65) Prior Publication Data
US 2019/0157573 A1    May 23, 2019

Related U.S. Application Data

(63) Continuation-in-part of application No. 15/578,483, filed as application No. PCT/KR2017/006734 on Jun. (Continued)

(30) Foreign Application Priority Data

Mar. 19, 2015 (KR) .................. 10-2015-0038424
Jul. 10, 2015 (KR) .................. 10-2015-0098309
(Continued)

(51) Int. Cl.
*H01L 51/00* (2006.01)
*H01L 51/05* (2006.01)
*B01J 20/22* (2006.01)

(52) U.S. Cl.
CPC ........ *H01L 51/0084* (2013.01); *B01J 20/226* (2013.01); *H01L 51/009* (2013.01);
(Continued)

(58) Field of Classification Search
CPC ..... H01L 51/422–4233; H01L 51/4253–4266; C09K 11/02; C09K 11/025; B01D 2253/204; B01J 20/226
See application file for complete search history.

(56) References Cited

U.S. PATENT DOCUMENTS 4,946,710 A    8/1990  Miller
6,433,359 B1   8/2002  Kelley et al.
(Continued)

FOREIGN PATENT DOCUMENTS

CN    101230265 A    7/2008
CN    102015900 A    4/2011
(Continued)

OTHER PUBLICATIONS

C. R. Kagan, D. B. Mitzi, C. D. Dmitrakopoulos, "Organic-Inorganic hybrid materials as semiconducting channels in thin-film field-effect transistors", Science, 286, p. 945-947 (Year: 1999).*
(Continued)

*Primary Examiner* — Eric R Smith
(74) *Attorney, Agent, or Firm* — Sughrue Mion, PLLC

(57) ABSTRACT

Disclosed are an organic semiconductor compound that exhibits chemical resistance and etch resistance while maintaining electrical characteristics and thus is applicable to an
(Continued)

existing photolithography process, thereby increasing process efficiency, and an organic semiconductor device using the same.

9 Claims, 6 Drawing Sheets
(1 of 6 Drawing Sheet(s) Filed in Color)

Related U.S. Application Data 26, 2017, now Pat. No. 10,529,937, and a continuation-in-part of application No. 14/986,852, filed on Jan. 4, 2016, now Pat. No. 10,164,190.

(30) Foreign Application Priority Data

| | | |
|---|---|---|
| Jun. 27, 2016 | (KR) | 10-2016-0079962 |
| Jun. 30, 2016 | (KR) | 10-2016-0082390 |
| Dec. 7, 2016 | (WO) | PCT/KR2016/014290 |
| Jan. 13, 2017 | (WO) | PCT/KR2017/000461 |
| Jun. 22, 2017 | (KR) | 10-2017-0079382 |

(52) U.S. Cl.
CPC .... *H01L 51/0558* (2013.01); *B01D 2253/204* (2013.01); *H01L 51/0028* (2013.01); *H01L 51/0094* (2013.01); *H01L 51/0541* (2013.01)

(56) References Cited

U.S. PATENT DOCUMENTS

| | | | |
|---|---|---|---|
| 6,653,701 | B1 | 11/2003 | Yamazaki |
| 6,833,180 | B1 | 12/2004 | Kodemura |
| 7,572,667 | B2 | 8/2009 | Ryu et al. |
| 7,800,101 | B2 | 9/2010 | Song et al. |
| 8,114,704 | B2 | 2/2012 | Kim et al. |
| 2004/0075120 | A1 | 4/2004 | Wu |
| 2004/0195563 | A1* | 10/2004 | Bao ............... G01N 27/4145 257/40 |
| 2005/0056828 | A1* | 3/2005 | Wada ............... B82Y 10/00 257/40 |
| 2006/0231827 | A1 | 10/2006 | Hanato et al. |
| 2007/0152370 | A1 | 7/2007 | Roberts |
| 2010/0006824 | A1 | 1/2010 | Hong et al. |
| 2010/0147365 | A1* | 6/2010 | DeSimone ............... B82Y 10/00 136/255 |
| 2010/0264404 | A1 | 10/2010 | Myung-Seok et al. |
| 2010/0288635 | A1 | 11/2010 | Komiya |
| 2011/0049481 | A1* | 3/2011 | Xavier ............... B82Y 10/00 257/40 |
| 2011/0049560 | A1 | 3/2011 | Li |
| 2011/0301276 | A1 | 12/2011 | Katayama et al. |
| 2013/0203198 | A1 | 8/2013 | Min |
| 2013/0234116 | A1* | 9/2013 | Lee ............... B82Y 10/00 257/40 |
| 2013/0345370 | A1 | 12/2013 | Ona et al. |
| 2014/0183507 | A1 | 7/2014 | Benwadih |
| 2015/0114814 | A1 | 4/2015 | Suzuki |
| 2015/0122314 | A1* | 5/2015 | Snaith ............... H01L 51/4213 136/255 |
| 2016/0276590 | A1 | 9/2016 | Kim et al. |

FOREIGN PATENT DOCUMENTS

| | | |
|---|---|---|
| CN | 102969277 A | 3/2013 |
| JP | 2007-019121 A | 1/2007 |
| JP | 2008-153354 A | 7/2008 |
| KR | 2004-0029143 A | 4/2004 |
| KR | 10-0668615 B1 | 1/2007 |
| KR | 10-0708720 B1 | 4/2007 |
| KR | 10-0737293 B1 | 7/2007 |
| KR | 10-0865500 B1 | 10/2008 |
| KR | 10-2009-0064514 A | 6/2009 |
| KR | 2010-0006294 A | 1/2010 |
| KR | 10-2010-0055410 A | 5/2010 |
| KR | 10-1174871 B1 | 8/2012 |
| KR | 2012-0095965 A | 8/2012 |
| KR | 10-1195550 B1 | 10/2012 |
| KR | 2013-0012823 A | 2/2013 |
| KR | 10-2014-0033466 A | 3/2014 |
| KR | 2014-0081249 A | 7/2014 |
| KR | 10-1508780 B1 | 4/2015 |
| KR | 2016-0055334 A | 5/2016 |
| KR | 10-1685071 B1 | 12/2016 |
| WO | 2008/090828 A1 | 7/2008 |
| WO | 20120164282 A1 | 12/2012 |

OTHER PUBLICATIONS

M. W. A. MacLean, et al., "Unraveling inter- and intrachain electronics in polythiophene assemblies mediated by coordination nanospaces", Angewandte Chemie International Edition, 55, p. 708-718 (Year: 2016).*
G. Yu et al., "Polymer photovoltaic cells: Enhanced efficiencies via a network of internal donor-acceptor heterojunctions", Science, 270, p. 1789-1791 (Year: 1995).*
European Search Report for 15203122.5 dated Jul. 15, 2016.
M.F. Calhoun "Electronic functionalization of the surface of organic semiconductors with self-assembled monolayers" Department of Physics and Astronomy, Rutgers University, Nov. 18, 2007, p. 84-89.
M. Contstantinou et al. "Interface Passivation and Trap Reduction via a Solution-Based Method for Near-Zero ZHyswteresis Nanowire Field-Effect Transistors" ACS Appl. Mater. Interfaces 2015, 7, 22115-22120.
International Search Report PCT/ISA/210 for International Application No. PCT/KR2017/000461 dated Apr. 14, 2017.
Written Opinion of the International Searching Authority PCT/ISA/237 for International Application No. PCT/KR2017/000461 dated Apr. 14, 2017.
International Search Report PCT/ISA/210 for International Application No. PCT/KR2016/014290 dated Mar. 9, 2017.
Written Opinion of the International Searching Authority PCT/ISA/237 for International Application No. PCT/KR2016/014290 dated Mar. 9, 2017.

* cited by examiner

[FIG. 1]
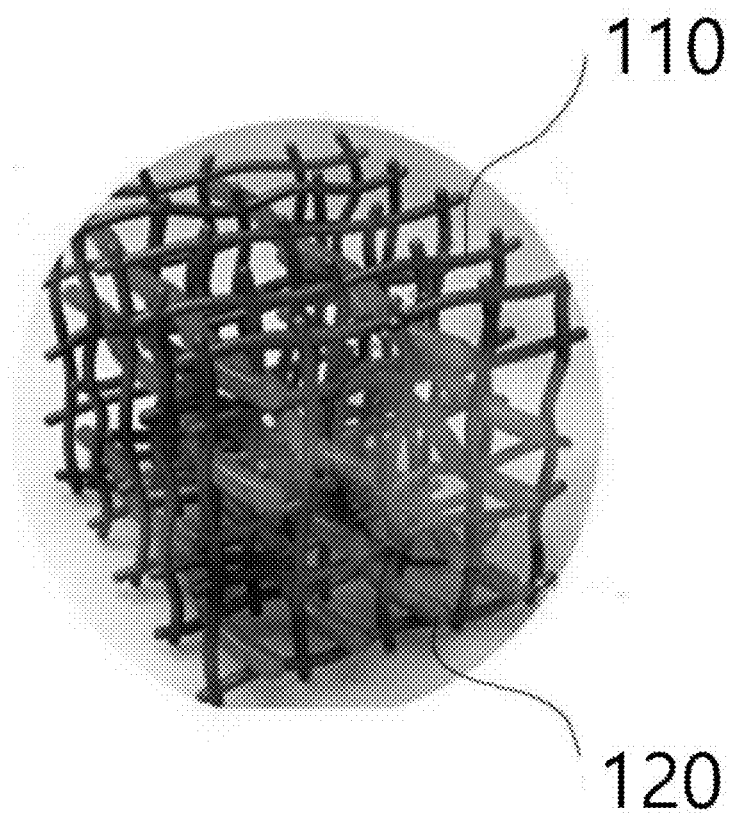

[FIG. 2A]
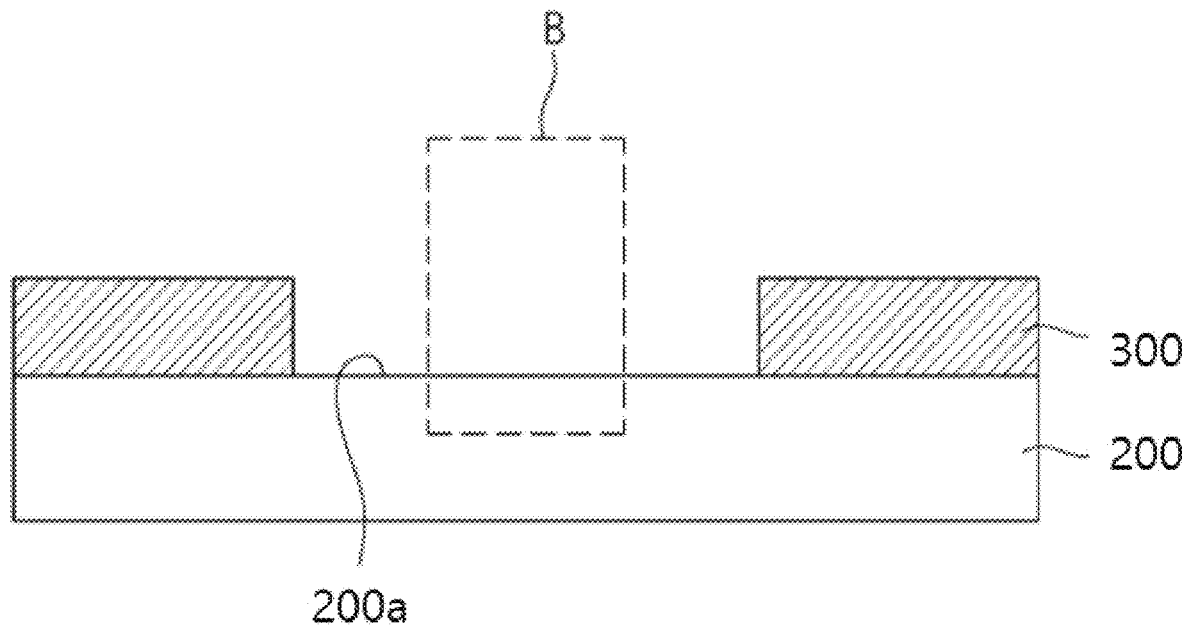
[FIG. 2B]
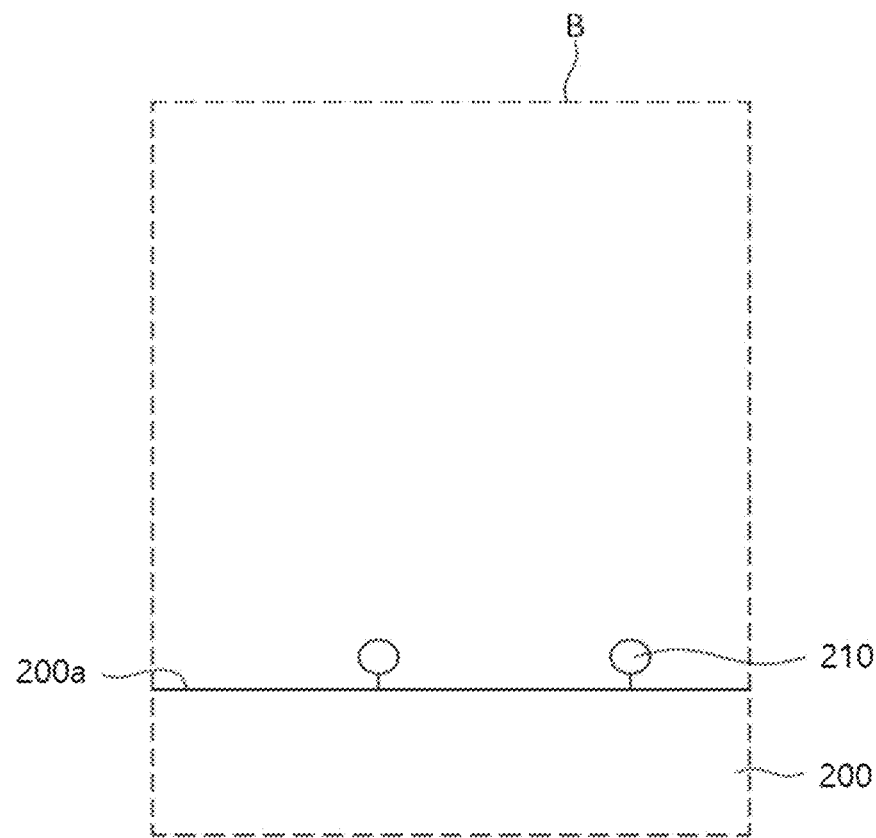

[FIG. 3A]
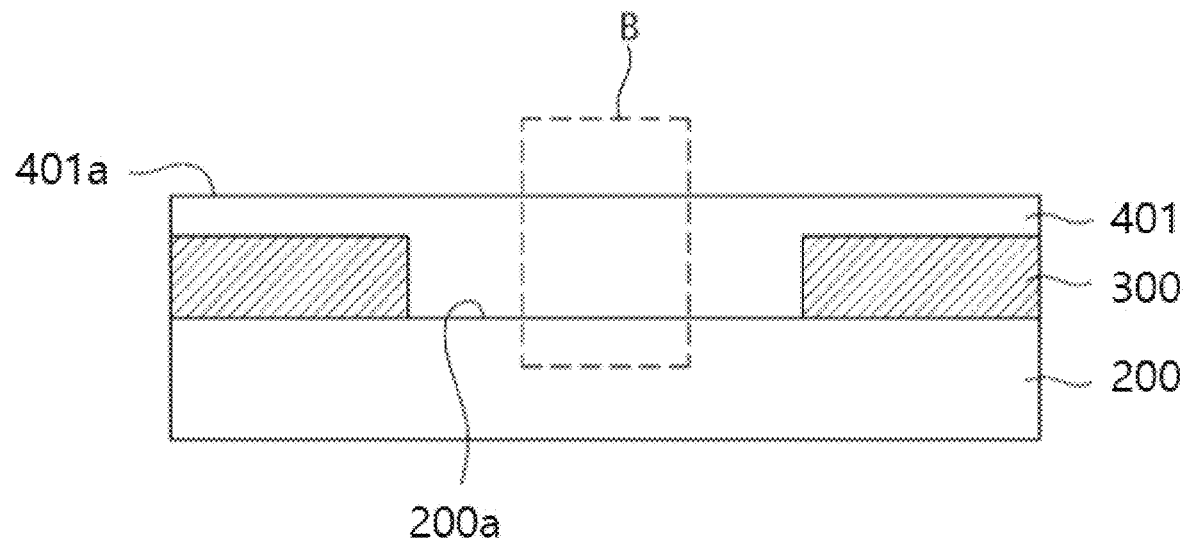
[FIG. 3B]
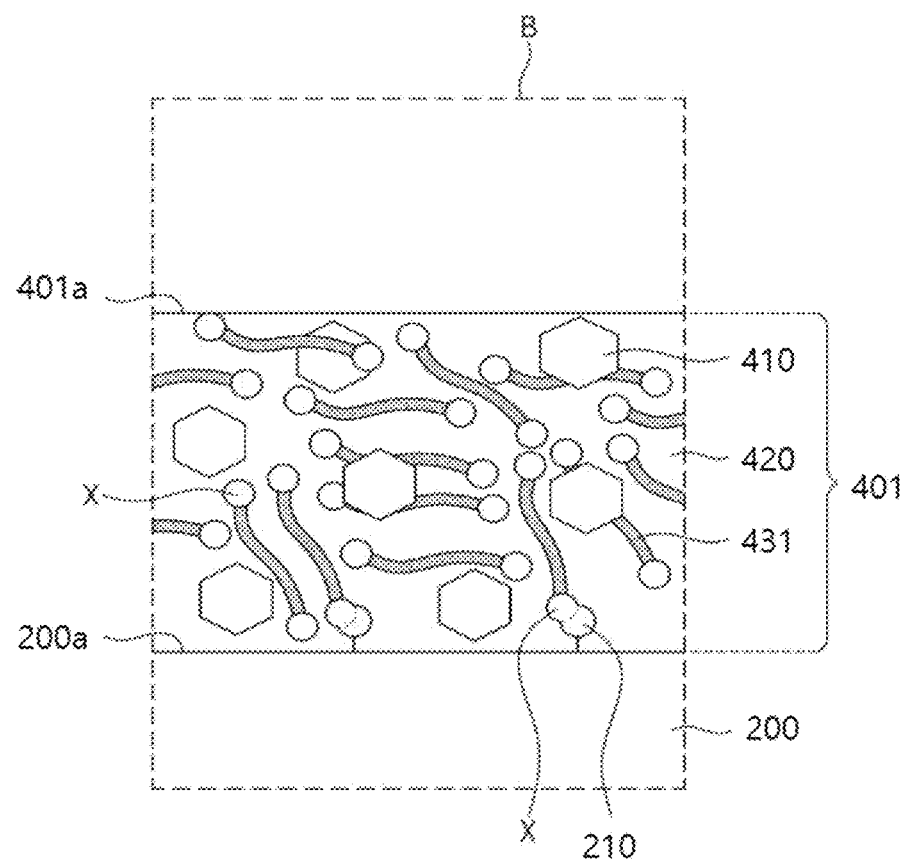

[FIG. 4A]
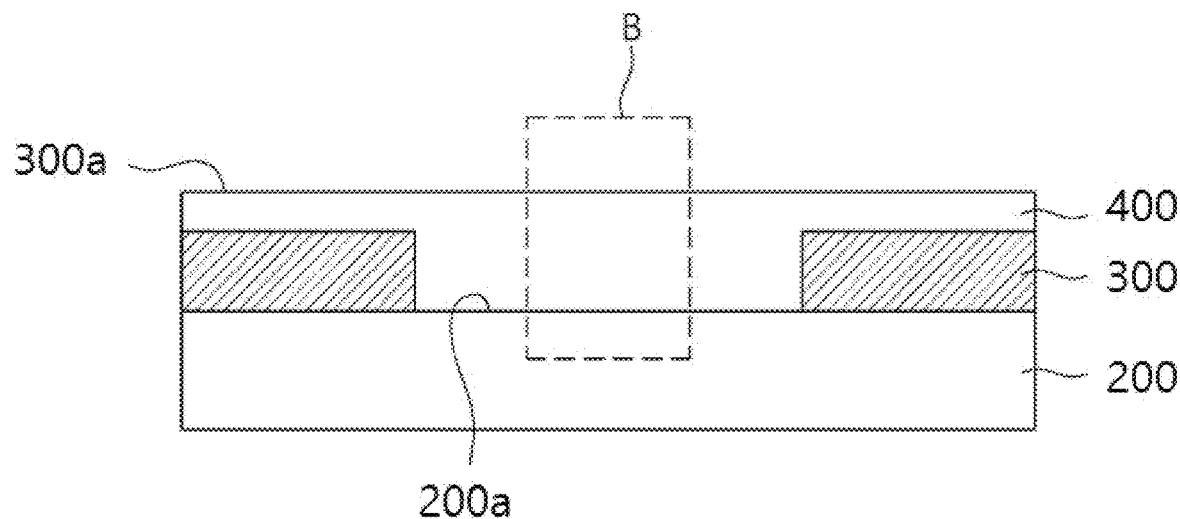
[FIG. 4B]
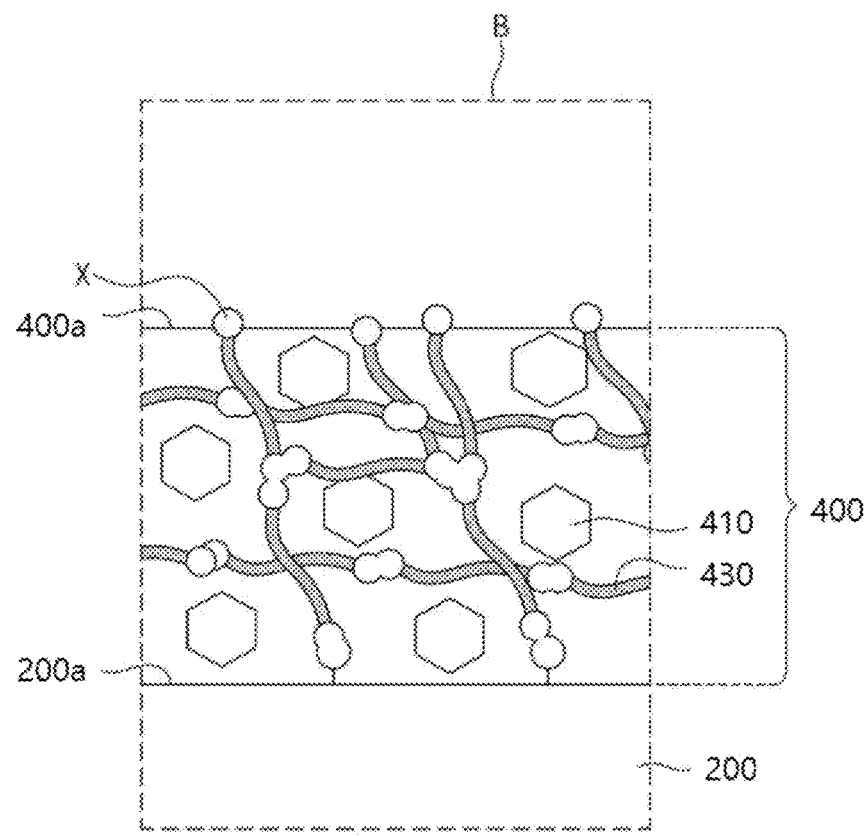

[FIG. 5A]
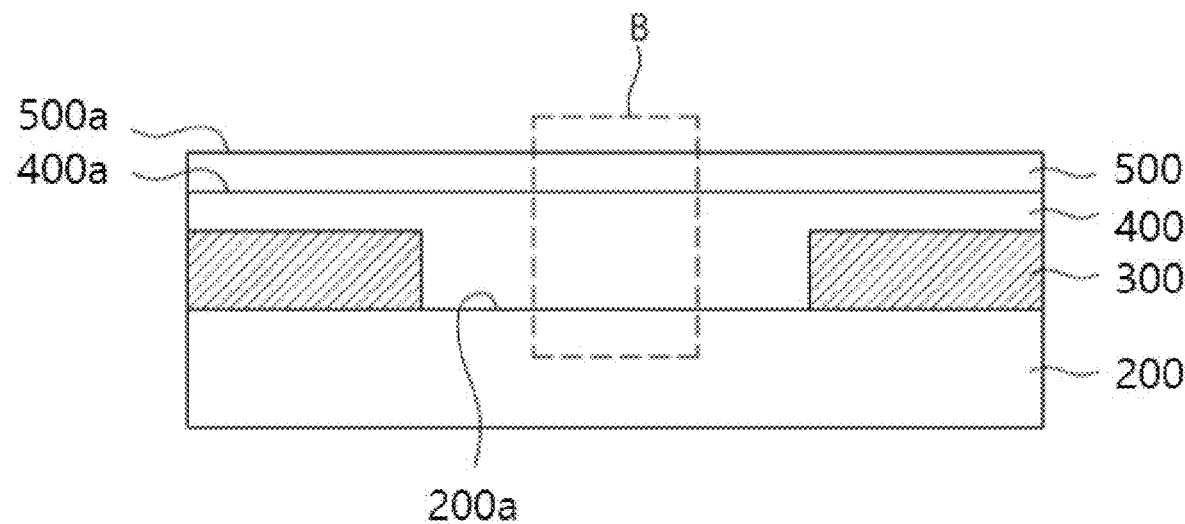
[FIG. 5B]
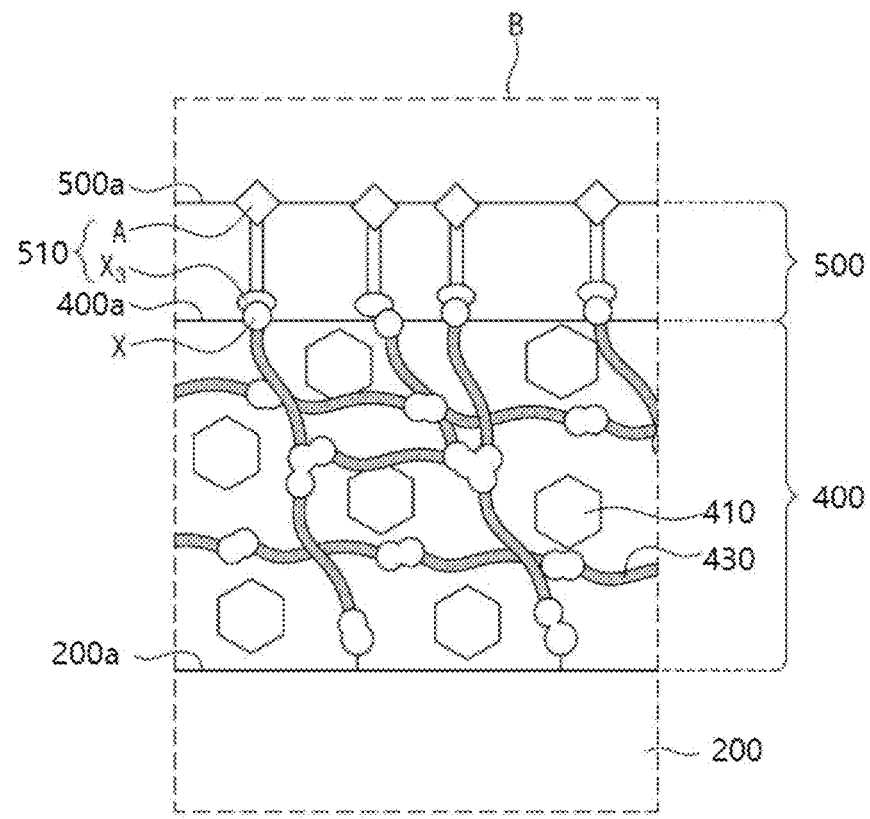

[FIG. 6A]
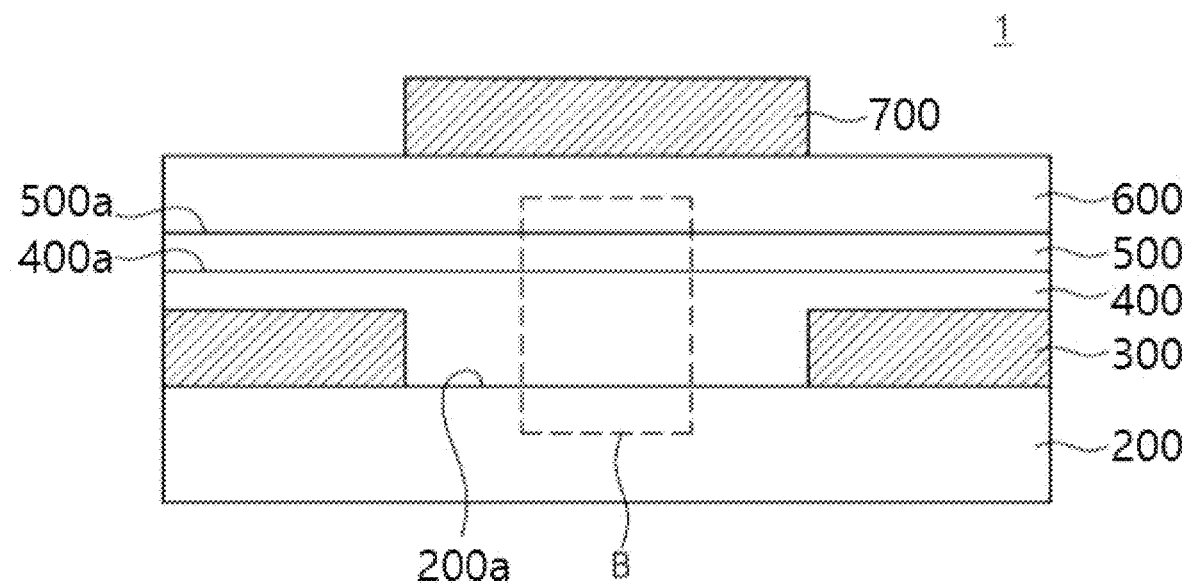
[FIG. 6B]
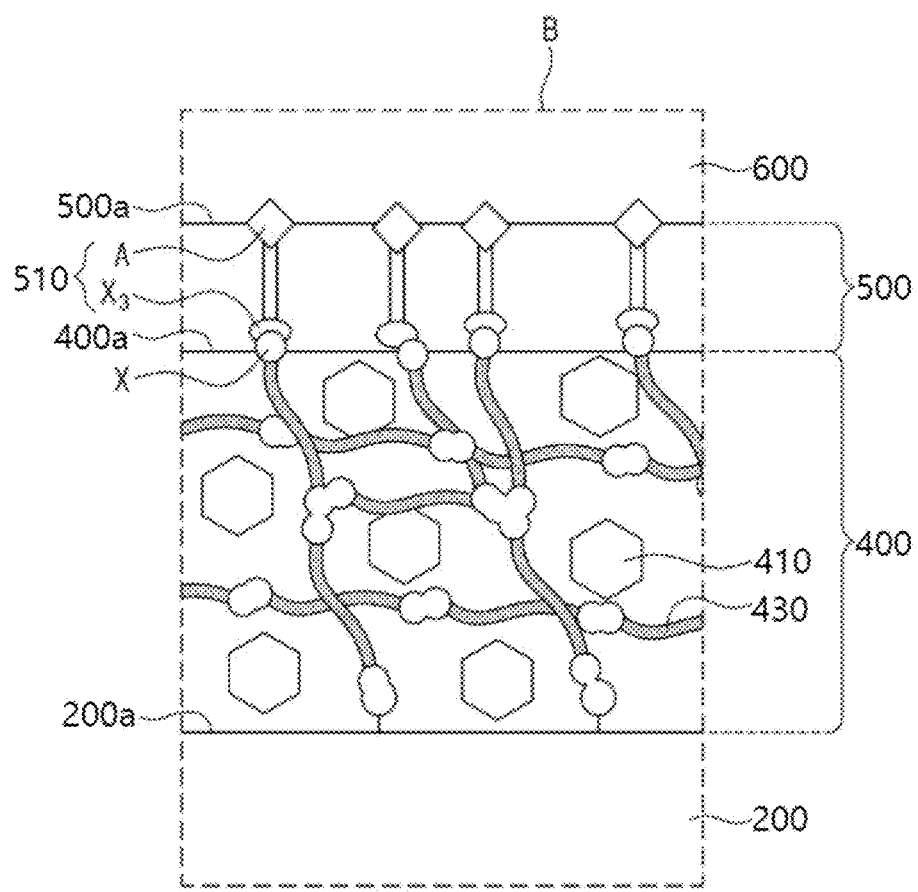

COMPOUND OF ORGANIC SEMICONDUCTOR AND ORGANIC SEMICONDUCTOR DEVICE USING THE SAME

CROSS-REFERENCE TO RELATED APPLICATIONS

This application is a continuation-in-part of U.S. patent application Ser. No. 14/986,852, filed on Jan. 4, 2016, now U.S. Pat. No. 10/164,190, which claims priority from Korean Patent Application No. 10-2015-0038424 filed Mar. 19, 2015 and Korean Patent Application No. 10-2015-0098309 filed Jul. 10, 2015, and is a continuation-in-part of U.S. patent application Ser. No. 15/578,483, filed on Nov. 30, 2017, now U.S. Pat. No. 10/529,937, which is a National Stage Entry of International Application No. PCT/KR2017/006734 filed Jun. 26, 2017, which claims priority from Korean Patent Application No. 10-2016-0079962 filed Jun. 27, 2016, Korean Patent Application No. 10-2016-0082390 filed Jun. 30, 2016, PCT/KR2016/014290 filed Dec. 7, 2016, PCT/KR2017/000461 filed Jan. 13, 2017, and Korean Patent Application No. 10-2017-0079382 filed Jun. 22, 2017, the contents of all of the prior applications are incorporated herein by reference in their entireties.

TECHNICAL FIELD

The present invention relates to a semiconductor device, and more particularly, to an organic semiconductor compound and an organic semiconductor device using the same.

BACKGROUND ART

Recently, research into application of flexible materials to displays, thin-film solar cells, and the like has been actively conducted.

In fabricating such electronic devices, it may be advantageous to use an organic semiconductor instead of a conventional inorganic semiconductor.

Accordingly, interest in an organic semiconductor device wherein channels are formed using an organic semiconductor material is increasing.

However, since organic semiconductors are more sensitive to the external environment than inorganic semiconductors, there is a need to improve the electrical characteristics and durability of organic semiconductor devices.

RELATED ART DOCUMENTS

Patent Documents

Korean Patent No. 10-0865500, entitled "ORGANIC SEMICONDUCTOR MATERIAL AND ORGANIC SEMICONDUCTOR DEVICE USING THE SAME"

Korean Patent Application Publication No. 10-2009-0064514, entitled "ELECTRONIC DEVICE USING ORGANIC SEMICONDUCTOR DEVICE"

Korean Patent Application Publication No. 10-2010-0055410, entitled "METHOD OF FABRICATING ORGANIC SEMICONDUCTOR DEVICE, ORGANIC SEMICONDUCTOR DEVICE, AND ORGANIC SEMICONDUCTOR DEVICE"

DISCLOSURE

Technical Problem

Therefore, the present invention has been made in view of the above problems, and it is one object of the present invention to provide a semiconductor device, and more particularly, to an organic semiconductor compound and an organic semiconductor device having improved durability by using the same.

Technical Solution

In accordance with an aspect of the present invention, the above and other objects can be accomplished by the provision of an organic semiconductor compound including a precursor structure; and an organic semiconductor, wherein the precursor structure and the organic semiconductor penetrate each other to form a three-dimensional network structure.

In the organic semiconductor compound according to an embodiment of the present invention, the precursor structure may be formed by gelating an organometallic precursor by hydrolysis and condensation reaction.

In the organic semiconductor compound according to an embodiment of the present invention, the organometallic precursor may be represented by Formula 1 below:

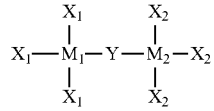

[Formula 1]

wherein M1 and M2 each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, Y is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group, and X1 and X2 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group includes an alkyl group substituted with a halogen element.

In the organic semiconductor compound according to an embodiment of the present invention, the organic semiconductor may be solated by being dissolved in an organic solvent.

In accordance with another aspect of the present invention, there is provided an organic semiconductor device including a substrate; an organic semiconductor layer formed on the substrate and including the organic semiconductor compound; and a self-assembled monolayer formed on the organic semiconductor layer using a self-assembling precursor, wherein reactive groups are included on an upper surface of the organic semiconductor layer, and the self-assembled monolayer is formed through a chemical bond between the reactive groups and the self-assembling precursor.

In the organic semiconductor device according to another embodiment of the present invention, functional groups may be included on an upper surface of the self-assembled monolayer, and the functional groups of the self-assembled monolayer may be different from the reactive groups of the organic semiconductor layer.

In the organic semiconductor device according to another embodiment of the present invention, the organic semiconductor layer may be formed using an organometallic precursor represented by Formula 1 below:

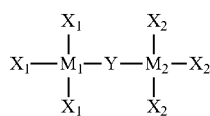

[Formula 1]

wherein M1 and M2 each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, Y is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group, and X1 and X2 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group includes an alkyl group substituted with a halogen element.

The organic semiconductor device according to another embodiment of the present invention may further include an insulating layer formed between the substrate and the organic semiconductor layer, wherein the organic semiconductor layer is formed through a chemical bond between the organometallic precursor and functional groups on the insulating layer.

The organic semiconductor device according to another embodiment of the present invention may further include a gate pattern formed between the substrate and the insulating layer; and source/drain patterns formed on the organic semiconductor layer.

The organic semiconductor device according to another embodiment of the present invention may further include an insulating layer formed on the self-assembled monolayer; a gate pattern formed on the insulating layer; and source/drain patterns formed between the substrate and the organic semiconductor layer.

In the organic semiconductor device according to another embodiment of the present invention, the self-assembling precursor may be represented by Formula 2 below:

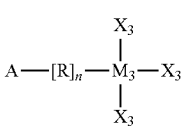

[Formula 2]

wherein A includes one of —NH2, —CH3, —SH, —COOH, —CF3, and a halogen element, the halogen element including one of F, Cl, Br, and I, R is one selected from among a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a substituted or unsubstituted C3 to C30 aryl group, a C3 to C30 heteroaryl group, halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxyl group, n is an integer of 0 to 30, M3 is one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Jr, Lr, Rf, Db, Sg, Bh, Hs, Mt, Ds, Rg, and Uub, and X3 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group of X3 includes an alkyl group substituted with a halogen element.

In the organic semiconductor device according to another embodiment of the present invention, the chemical bond may include a silanol bond.

Advantageous Effects

As apparent from the above description, an organic semiconductor compound according to an embodiment of the present invention exhibits chemical resistance and etching resistance while maintaining optoelectrical characteristics, thereby being applicable to an existing photolithography process and increasing process efficiency.

Various materials included in an organic semiconductor device according to another embodiment of the present invention can combine and interact with functional groups of a self-assembling precursor, thereby increasing binding force of an insulating layer and an organic semiconductor layer. Accordingly, current-voltage characteristics (current increase, threshold voltage control) of an organic semiconductor device can be improved.

An organic semiconductor device according to another embodiment of the present invention can induce strong binding of an interface between an insulator including a silanol bond on a surface thereof and a gelated organic semiconductor layer, thereby securing interface stability against external mechanical stimuli and thus being easily applied to flexible electronic devices.

DESCRIPTION OF DRAWINGS

The application file contains at least one drawing executed in color. Copies of this application publication with the color drawings will be provided by the Office upon request and payment of the necessary fee.

FIG. 1 is a schematic diagram illustrating the structure of an organic semiconductor compound according to an embodiment of the present invention.

FIGS. 2A, 3A, 4A, 5A, and 6A are sectional views sequentially illustrating a process of fabricating an organic semiconductor device according to another embodiment of the present invention. In addition, FIGS. 2B, 3B, 4B, 5B, and 6B respectively illustrate B regions of FIGS. 2A, 3A, 4A, 5A, and 6A.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context.

It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc.

Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, embodiments of the present invention are more fully described with reference to the accompanying drawings.

FIG. 1 is a schematic diagram illustrating the structure of an organic semiconductor compound according to an embodiment of the present invention.

Referring to FIG. 1, a final product of the organic semiconductor compound according to an embodiment of the present invention may have a three-dimensional network structure wherein an organic semiconductor 120 passes through gaps of a precursor 110 having a two-dimensional lattice structure.

In addition, the structure of the precursor 110 is not limited to the two-dimensional lattice structure and may be a random structure.

When the precursor 110 has a random structure, the precursor 110 and the organic semiconductor 120 may penetrate each other to form a three-dimensional network structure, instead of the organic semiconductor 120 orthogonally passing through gaps of the precursor 110.

Accordingly, hardness of the organic semiconductor compound may be controlled by adjusting ratios of the precursor 110 and the organic semiconductor 120 according to the purpose of a user.

An organometallic precursor may be formed to have a ladder-like two-dimensional structure in a step of gelating the same by hydrolysis and condensation reaction.

When a precursor is gelated, the precursor may be formed to have a ladder-like two-dimensional structure at a specific temperature (70° C. to 90° C.).

Here, the organometallic precursor may include a metal (M) and a reactive group (X). Here, the reactive group may be formed by synthesizing various substances according to purpose.

Accordingly, in the step of gelating an organometallic precursor, the organometallic precursor may be gelated to have a two-dimensional lattice structure through a gelation process including hydrolysis and condensation reaction.

In general, the metal may include one or more metals selected from the group consisting of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub.

In addition, the reactive group (X) may be selected from among a hydrogen atom, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group, and a silyl group.

More particularly, the organometallic precursor may be represented by Formula 1 below.

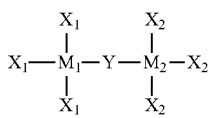

[Formula 1]

wherein M1 and M2 each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, Y is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group, and X1 and X2 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group includes an alkyl group substituted with a halogen element.

In accordance with an embodiment of the present invention, Formula 1, at least one of $X_1$ and $X_2$ may be a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

In addition, in accordance with an embodiment of the present invention, in Formula 1, at least one of $X_1$ and at least one of X2 may be each independently a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The organometallic precursor may include the first reactive groups X bonded with an inorganic element. The inorganic element may be denoted as $M_1$ and $M_2$ in Formula 1. The first reactive group (X) may be at least one of groups denoted as $X_1$ and $X_2$ in Formula 1. The first reactive group (X) may include at least one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The gelated organometallic precursor 110 may include a plurality of organometallic precursors. These organometallic precursors may react with each other, thereby forming a two-dimensional lattice structure.

The organic semiconductor 120 may be dissolved in an organic solvent, thereby being solated. Here, the organic solvent may include one of chloroform, dichloromethane, acetone, pyridine, tetrahydrofuran, chlorobenzene, toluene, and dichlorobenzene or a mixture thereof.

Next, an organic semiconductor compound having a three-dimensional network structure wherein the solated organic semiconductor 120 orthogonally passes through gaps of a lattice structure of the gelated organometallic precursor 110 may be formed by stirring the gelated organometallic precursor 110 having a two-dimensional lattice structure and the solated organic semiconductor 120 while maintaining a certain temperature.

Here, the solated organic semiconductor and the gelated precursor may be stirred at about 80° C., but the present invention is not limited thereto.

Hereinafter, an organic semiconductor device according to another embodiment of the present invention is described in detail with reference to FIGS. 2A to 6B.

Through the following detailed description of a fabrication method, the bonding and structure of each layer constituting the organic semiconductor device can be confirmed in detail FIGS. 2A, 3A, 4A, 5A, and 6A are sectional views sequentially illustrating a process of fabricating an organic semiconductor device according to another embodiment of the present invention. In addition, FIGS. 2B, 3B, 4B, 5B, and 6B respectively illustrate B regions of FIGS. 2A, 3A, 4A, 5A, and 6A.

Referring to FIGS. 2A and 2B, source/drain patterns 300 may be formed on a substrate 200.

The substrate 200 may include an insulating material. For example, the substrate 200 may include an inorganic material such as silicon or glass. For example, the substrate 200 may include an organic material such as plastic or a polymer.

The substrate 200 may include functional groups 210 on an upper surface 200a thereof. The functional groups 210 of the substrate 200 may include at least one of a silanol group, a carboxyl group, a C1 to C30 alkoxycarbonyl group, a C3 to C30 aryloxycarbonyl group, and a hydroxyl group.

The source/drain patterns 300 may include a conductive material. For example, the source/drain patterns 300 may include at least one of a metal, doped polysilicon, a conductive polymer, and a conductive carbon material. Here, the conductive carbon material may include graphene. The source/drain patterns 300 may be formed to an upper surface 200a of the substrate 200.

In accordance with an embodiment, the functional groups 210 of the present invention, the substrate 200 may be covered by impurities (not shown).

The impurity may include a carbon-containing material, but the present invention is not limited thereto. To remove the impurity, a cleaning process may be further performed on the upper surface 200a of the substrate 200.

The cleaning process may be performed by oxygen plasma treatment or etching treatment using ozone and ultraviolet light.

By such a cleaning process, impurities may be removed and the functional groups 210 of the substrate 200 may be exposed.

Referring to FIGS. 3A and 3B, a preliminary organic semiconductor layer 401 may be formed on a substrate 200 to cover source/drain patterns 300.

The preliminary organic semiconductor layer 401 may include an organic semiconductor material 410, an organometallic precursor 431, and an organic solvent 420.

The organic semiconductor material 410 and the organometallic precursor 431 may be provided inside the organic solvent 420.

An organic semiconductor may mean an organic compound having semiconducting properties. For example, an organic compound having a π-conjugation structure may function as an organic semiconductor.

The π-conjugation structure may be a structure wherein electrons are delocalized in p orbitals of an organic compound in which multiple bonds and single bonds are alternatingly disposed.

The organic compound may be composed of carbon atoms and hydrogen atoms. For example, the organic compound may further include a heteroatom. The heteroatom may include at least one of nitrogen, sulfur, and oxygen.

The organic semiconductor material 410 may be an organic compound having organic semiconducting properties, as described above. The organic semiconductor material 410 may include at least one of, for example, polyacetylene, polypyrrole, polyaniline, polythiophene (PTh), poly(p-phenylenevinylene (PPV)), and derivatives thereof.

The organic semiconductor material 410 may include at least one of, for example, polythiophene-based materials, polypyrrole-based materials, poly(p-phenylenevinylene)-based materials, polyanilines, polyacetylenes, polydiacetylenes, polycarbazoles, polyfuran-based materials, polyheteroaryls, nitrogen-containing aromatic compounds, condensed polycyclic aromatic compounds, aromatic amine derivatives, bis-carbazole derivatives, pyrazoline derivatives, stilbene-based compounds, hydrazine-based compounds, metal phthalocyanines, metal porphyrin-based materials, condensed rings, and organic pigments.

Here, the polythiophene-based materials may include poly-3-hexylthiophene or polybenzothiophene.

The poly(p-phenylenevinylene)-based materials may include poly(p-phenylenevinylene).

The polyfuran-based materials may include polyfuran or polybenzofuran.

A constituent unit of the polyheteroaryl-based materials may be a nitrogen-containing aromatic ring. The polyheteroaryl-based materials may include, for example, pyridine, quinoline, phenanthroline, oxazole, or oxadiazole.

The condensed polycyclic aromatic compounds may include anthracene, pyrene, naphthacene, pentacene, hexacene, or rubrene.

The nitrogen-containing aromatic compound may include furan, thiophene, benzothiophene, dibenzofuran, pyridine, quinoline, phenanthroline, oxazole, or oxadiazole.

The aromatic amine derivatives may include 4,4′-bis(N-(3-methylphenyl)-N-phenylamino)biphenyl.

The bis-carbazole derivatives may include bis(N-allylcarbazole) or bis(N-alkylcarbazole).

The metal phthalocyanines may include copper phthalocyanine.

The metal porphyrins may include copper porphyrin.

The condensed rings may include a distyrylbenzene derivative, an aminostyryl derivative, an aromatic acetylene derivative, naphthalene-1,4,5,8-tetracarboxylic acid diimide, or perylene-3,4,9,10-tetracarboxylic acid diimide.

The organic pigments may include tetracarboxylic acid diimides, merocyanine, phenoxazine, or rhodamine.

However, the organic semiconductor material 410 may include various materials without being limited to the aforementioned materials.

The organometallic precursor may be represented by Formula 1 below:

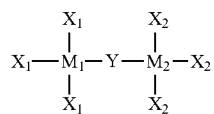

[Formula 1]

wherein M1 and M2 each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, Y is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group, and X1 and X2 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group includes an alkyl group substituted with a halogen element.

In accordance with an embodiment of the present invention, Formula 1, at least one of $X_1$ and $X_2$ may be a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

In addition, in accordance with an embodiment of the present invention, in Formula 1, at least one of $X_1$ and at least one of X2 may be each independently a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The organometallic precursor may include the first reactive groups X bonded with an inorganic element. The inorganic element may be denoted as $M_1$ and $M_2$ in Formula 1. The first reactive group (X) may be at least one of groups denoted as $X_1$ and $X_2$ in Formula 1. The first reactive group (X) may include at least one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The organic solvent 420 may include at least one of chloroform, dichloromethane, acetone, pyridine, tetrahydrofuran, chlorobenzene, dichlorobenzene, xylene, trichlorobenzene, toluene, and a mixture thereof.

In accordance with an embodiment of the present invention, an organic semiconductor solution may be prepared by mixing the organic semiconductor material 410, the organic solvent 420, and the organometallic precursor 431.

The organic semiconductor solution may be coated on the substrate 200, thereby forming the preliminary organic semiconductor layer 401.

For example, the organic semiconductor solution may be coated by a spin coating method, a spray coating method, an inkjet printing method, a dip coating method, a drop casting method, or a bar coating method.

As shown in FIG. 3A, the preliminary organic semiconductor layer 401 may cover the source/drain patterns 300 and the substrate 200.

In addition, as shown in FIG. 3B, first reactive groups X of the organometallic precursor 431 may react with functional groups 210 of the substrate 200.

Reaction between the first reactive groups X of the organometallic precursor 431 and the functional groups 210 of the substrate 200 may include condensation reaction.

Accordingly, a chemical bond (e.g., covalent bond) may be formed between the preliminary organic semiconductor layer 401 and the substrate 200.

For example, the first reactive groups X of the organometallic precursor 431 and the functional groups 210 of the substrate 200 may be silanol groups.

In this case, a siloxane bond may be formed between the preliminary organic semiconductor layer 401 and the substrate 200.

When impurities (not shown) are provided on the functional groups 210, it may be difficult to react the organometallic precursor 431 with the functional groups 210 of the substrate 200.

In this case, binding force between the substrate 200 and the preliminary organic semiconductor layer 401 may be reduced.

In accordance with an embodiment of the present invention of the present invention, impurities are removed by a cleaning process of FIGS. 3A and 3B, thereby increasing binding force between the substrate 200 and the preliminary organic semiconductor layer 401.

The first reactive groups X of the organometallic precursor 431 may function as a dopant of the organic semiconductor material 410.

In the preliminary organic semiconductor layer 401, the content of the first reactive groups X of the organometallic precursor 431 may be higher than that of the organic semiconductor material 410.

The preliminary organic semiconductor layer 401 may exhibit conductivity. The organometallic precursor 431 may include a plurality of organometallic precursors 431. These organometallic precursors 431 may be dispersed in the preliminary organic semiconductor layer 401.

The first reactive groups X of the organometallic precursors 431 may be provided on an upper surface 401a of the preliminary organic semiconductor layer 401 and inside the preliminary organic semiconductor layer 401.

Referring to FIGS. 3A, 3B, 4A, and 4B in sequence, the preliminary organic semiconductor layer 401 may be annealed to form an organic semiconductor layer 400.

The annealing of the preliminary organic semiconductor layer 401 may be performed by heat-treating the same at 50° C. to 300° C.

When the preliminary organic semiconductor layer 401 is heat-treated at a temperature higher than 300° C., the organic semiconductor layer 400 may be damaged.

The preliminary organic semiconductor layer 401 may be gelated by the annealing process. During the annealing process, the organic solvent 420 may be removed.

In the annealing process, the first reactive groups X of the organometallic precursors 431 may react with each other.

The reaction between the organometallic precursors 431 may include hydrolysis or condensation reaction.

Accordingly, the organometallic precursors 431 may be bonded (e.g., cross-linked) to one another, thereby forming a lattice structure 430 of FIG. 4B.

The organic semiconductor layer 400 may include the lattice structure 430 and the organic semiconductor material 410.

The lattice structure 430 may have a ladder-like structure, but the present invention is not limited thereto.

The lattice structure 430 may be bonded to the substrate 200.

End portions of the lattice structure 430 may be exposed to the upper surfaces 400a of the organic semiconductor layer 400 and may include the first reactive groups X.

The first reactive groups X of the lattice structure 430 may be derived from the first reactive groups X of the organometallic precursors 431 of FIG. 3B.

In the present specification, the first reactive groups X of the organic semiconductor layer 400 may mean the first reactive groups X of the lattice structure 430.

Due to the lattice structure 430, chemical resistance and durability of the organic semiconductor layer 400 may be improved.

The organic semiconductor material 410 may be dispersed in the lattice structure 430, and the organic semiconductor material 410 may not chemically bond to the lattice structure 430.

The organic semiconductor material 410 may physically contact the lattice structure 430.

In accordance with embodiments of the present invention, the first reactive groups X may be bonded to each other to form the lattice structure 430.

The content of the first reactive groups X in the organic semiconductor layer 400 may be lower than that of the first reactive groups X in the preliminary organic semiconductor layer 401.

For example, the first reactive groups X may be provided on the upper surfaces 400a of the organic semiconductor layer 400, but not in the organic semiconductor layer 400.

When the functional groups 210 of the substrate 200 (see FIG. 2B) remain, the functional groups 210 may function as an electron/hole trap. In accordance with embodiments of the present invention, the functional groups 210 of the substrate 200 are removed, thereby improving electrical characteristics of the organic semiconductor layer 400.

Referring to FIGS. 5A and 5B, a self-assembling precursor 510 may be coated on an organic semiconductor layer 400, thereby forming a self-assembled monolayer 500.

Here, the self-assembling precursor 510 may be represented by Formula 2 below:

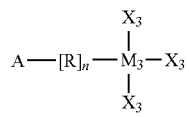

[Formula 2]

wherein A includes one of —NH2, —CH3, —SH, —COOH, —CF3, and a halogen element, the halogen element including one of F, Cl, Br, and I, R is one selected from among a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a substituted or unsubstituted C3 to C30 aryl group, a C3 to C30 heteroaryl group, halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxyl group, the substituted alkyl group including an alkyl group substituted with a halogen element, n is an integer of 0 to 30, M3 is one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Jr, Lr, Rf, Db, Sg, Bh, Hs, Mt, Ds, Rg, and Uub, and X3 are each independently one selected from among a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, the substituted alkyl group of X3 including an alkyl group substituted with a halogen element.

In accordance with an embodiment of the present invention, Formula 2, at least one of $X_3$ may be one selected from among a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The self-assembling precursor 510 may be selected from the group consisting of, for example, octyltrichlorosilane (OTS), octyltrimethoxysilane (OTMS), octyltriethoxysilane (OTES), hexamethyldisilazane (HMDS), octadecyltrichlorosilane (ODTS), octadecyltrimethoxysilane (OTMS), octadecyltriethoxysilane (OTE), (3-aminopropyl)trichlorosilane, (3-aminopropyl)trimethoxysilane (APTMS), (3-aminopropyl)triethoxysilane (APTES), fluoroalkyl trichlorosilane (FTS), perfluorodecyltrichlorosilane (PFTS), perfluorodecyltrimethoxysilane (PFMS), perfluorodecyltriethoxysilane (PFES), mercaptopropyltrichlorosilane (MPTCS), mercaptopropyltrimethoxysilane (MPTMS), mercaptopropyltriethoxysilane (MPTES), heptadecafluoro-1,1,2,2 tetrahydrodecyl)trichlorosilane (FDTS), heptadecafluoro-1,1,2,2-tetrahydrodecyl)trimethoxysilane; (FDMS), heptadecafluoro-1,1,2,2-tetrahydrodecyl)triethoxysilane (FDES), 1H,1H,2H,2H-perfluorodecyltrichlorosilane (FOTS), 1H,1H,2H,2H-perfluorodecyltrimethoxysilane (FOMS), 1H,1H,2H,2H-perfluorodecyltriethoxysilane (FOES), dichlorodimethylsilane (DDMS), trichloromethylsilane (TCMS), 3-aminopropyl(triethoxysilane) (APS), trimethoxysilylpropyldiethylenetriamine (DETA), N-(2-aminoethyl)-3-aminopropyltrimethoxysilane (EDA), and combinations thereof.

As shown in FIG. 5B, the self-assembling precursor 510 may include second reactive groups $X_3$ and functional groups A. The second reactive groups $X_3$ of the self-assembling precursor 510 may be at least one of groups represented by $X_3$ in Formula 2.

The second reactive groups $X_3$ may be selected from among a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group.

The functional groups A of the self-assembling precursor 510 may be represented as A in Formula 2.

One of the second reactive groups $X_3$ of the self-assembling precursor 510 may react with one of the first reactive groups X of the organic semiconductor layer 400.

Accordingly, the self-assembled monolayer 500 may be chemically bonded with the organic semiconductor layer 400.

The chemical bond between the self-assembled monolayer 500 and the organic semiconductor layer 400 may include a covalent bond (e.g., silanol bond).

The functional groups A of the self-assembling precursor 510 may not react with the first reactive groups X of the organic semiconductor layer 400.

Accordingly, the self-assembled monolayer 500 may have the functional groups A, and the functional groups A of the self-assembled monolayer 500 may be derived from the functional groups A of the self-assembling precursor 510.

The functional groups A of the self-assembled monolayer 500 may be provided on an upper surface 500a of the self-assembled monolayer 500.

The upper surface 500a of the self-assembled monolayer 500 may be opposite to the organic semiconductor layer 400.

The functional groups A of the self-assembled monolayer 500 may be different from the first reactive groups X of the organic semiconductor layer 400.

Affinity of the self-assembled monolayer 500 for a material may be different from affinity of the organic semiconductor layer 400 for the material.

Here, the affinity of the self-assembled monolayer 500 may mean affinity of the functional groups A of the self-assembled monolayer 500, and the affinity of the organic semiconductor layer 400 may mean affinity of the first reactive groups X of the organic semiconductor layer 400.

In the present specification, affinity may be used as a meaning including the ability to react with a substance or the ability to interact with a substance.

Referring to FIGS. 6A and 6B, an insulating layer 600 may be formed on an upper surface 500a of a self-assembled monolayer 500.

The insulating layer 600 may include an inorganic insulating material such as silicon oxide.

For example, the insulating layer 600 may include organic insulating material. The organic insulating material may include at least one of polyvinyl alcohol (PVA), polyvinyl phenol (PVP), polymethyl methacrylate (PMMA), and polyimide (PI).

The insulating layer 600 may have functional groups.

Binding force between the insulating layer 600 and the self-assembled monolayer 500 may be determined by affinity between the functional groups of the insulating layer 600 and the self-assembled monolayer 500.

The affinity of the self-assembled monolayer 500 to the insulating layer 600 may have greater than the affinity of the organic semiconductor layer 400 to the insulating layer 600.

When the binding force between the insulating layer 600 and the self-assembled monolayer 500 increases, durability of an organic semiconductor device 1 may increase.

The insulating layer 600 may be easily formed on the upper surface 500a of the self-assembled monolayer 500.

In accordance with embodiments of the present invention, electrical characteristics may be further improved according to the characteristics of the self-assembled monolayer 500 imparted due to the self-assembled monolayer 500 formed on the organic semiconductor layer 400.

A gate pattern 700 may be formed on the insulating layer 600, and the gate pattern 700 may include a conductive material.

For example, the gate pattern 700 may include at least one of a metal, doped polysilicon, a conductive polymer, and a conductive carbon material.

According to the aforementioned fabrication steps, the organic semiconductor device 1 according to another embodiment of the present invention may be fabricated.

The organic semiconductor device according to another embodiment of the present invention may include the organic semiconductor compound according to an embodiment of the present invention as a semiconductor layer.

The organic semiconductor device may be a sensor for analyzing a sample containing a biomaterial or chemical in a liquid, solid, or gaseous state.

In addition, the organic semiconductor device according to another embodiment of the present invention may be an organic solar cell including the organic semiconductor compound according to an embodiment of the present invention as an active layer.

In addition, the organic semiconductor device according to another embodiment of the present invention may be an organic light-emitting diode including the organic semiconductor compound according to an embodiment of the present invention as a light emitting layer.

Meanwhile, embodiments of the present invention disclosed in the present specification and drawings have been only provided to help understanding of the present invention and the scope of the present invention is not limited to the embodiments. It will be apparent to those skilled in the art that various modifications can be made to the above-described exemplary embodiments of the present invention without departing from the spirit or scope of the invention.

The invention claimed is:
1. An organic semiconductor compound, comprising:
a precursor structure; and
an organic semiconductor,
wherein the organic semiconductor penetrates the precursor structure to form a three-dimensional network structure,
wherein the precursor structure is formed by gelating an organometallic precursor by hydrolysis and condensation reaction,
wherein the organometallic precursor is represented by Formula 1 below:

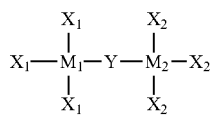
[Formula 1]

wherein M1 and M2 each independently comprise at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub,
Y is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group, and
X1 and X2 are each independently one selected from the group consisting of a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group comprises an alkyl group substituted with a halogen element.
2. The organic semiconductor compound according to claim 1, wherein the organic semiconductor is solated by being dissolved in an organic solvent.
3. An organic semiconductor device, comprising:
a substrate;
an organic semiconductor layer formed on the substrate and comprising the organic semiconductor compound according to claim 1; and
a self-assembled monolayer formed on the organic semiconductor layer using a self-assembling precursor,
wherein reactive groups are comprised on an upper surface of the organic semiconductor layer, and
the self-assembled monolayer is formed through a chemical bond between the reactive groups and the self-assembling precursor.
4. The organic semiconductor device according to claim 3, wherein functional groups are comprised on an upper surface of the self-assembled monolayer, and
the functional groups of the self-assembled monolayer are different from the reactive groups of the organic semiconductor layer.
5. The organic semiconductor device according to claim 3, further comprising an insulating layer formed between the substrate and the organic semiconductor layer,
wherein the organic semiconductor layer is formed through a chemical bond between the organometallic precursor and functional groups on the insulating layer.
6. The organic semiconductor device according to claim 5, further comprising:
a gate pattern formed between the substrate and the insulating layer; and
source/drain patterns formed on the organic semiconductor layer.
7. The organic semiconductor device according to claim 3, further comprising:
an insulating layer formed on the self-assembled monolayer;
a gate pattern formed on the insulating layer; and
source/drain patterns formed between the substrate and the organic semiconductor layer.
8. The organic semiconductor device according to claim 3, wherein the self-assembling precursor is represented by Formula 2 below:

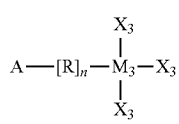
[Formula 2]

wherein A comprises one of $NH_2$, $CH_3$, —SH, —COOH, $CF_3$, and a halogen element, the halogen element comprising one of F, Cl, Br, and I,
R is one selected from the group consisting of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a substituted or unsubstituted C3 to C30 aryl group, a C3 to C30 heteroaryl group, halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxyl group,
n is an integer of 0 to 30,
M3 is one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, and X3 are each independently one selected from the group consisting of a hydrogen atom, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxyl group, wherein the substituted alkyl group of X3 comprises an alkyl group substituted with a halogen element.

9. The organic semiconductor device according to claim 3, wherein the chemical bond comprises a silanol bond.

\* \* \* \* \*